(12) United States Patent
Fontana

(10) Patent No.: US 12,021,052 B2
(45) Date of Patent: Jun. 25, 2024

(54) METHOD OF MANUFACTURING SEMICONDUCTOR PRODUCTS, SEMICONDUCTOR PRODUCT, DEVICE AND TESTING METHOD

(71) Applicant: STMicroelectronics S.r.l., Agrate Brianza (IT)

(72) Inventor: Fulvio Vittorio Fontana, Monza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 625 days.

(21) Appl. No.: 17/158,781

(22) Filed: Jan. 26, 2021

(65) Prior Publication Data

US 2021/0233884 A1    Jul. 29, 2021

(30) Foreign Application Priority Data

Jan. 29, 2020   (IT) .................. 102020000001729

(51) Int. Cl.
*H01L 21/56*   (2006.01)
*G01N 21/956*   (2006.01)
(Continued)

(52) U.S. Cl.
CPC ....... *H01L 24/19* (2013.01); *G01N 21/95684* (2013.01); *H01L 21/565* (2013.01);
(Continued)

(58) Field of Classification Search
CPC .................. H01L 22/10; H01L 22/12; H01L 2224/75155; H01L 2224/76155;
(Continued)

(56) References Cited

U.S. PATENT DOCUMENTS 11,721,559 B2 *   8/2023   Yu ..................... H01L 23/49838
                                                              257/774
2010/0072599 A1   3/2010   Camacho et al.
(Continued)

FOREIGN PATENT DOCUMENTS

EP        3531441 A1    8/2019

OTHER PUBLICATIONS

IT Search Report and Written Opinion for IT Appl. No. 102020000001729 dated Apr. 17, 2020 (16 pages).

*Primary Examiner* — Nicholas J Tobergte
*Assistant Examiner* — William Henry Anderson
(74) *Attorney, Agent, or Firm* — Crowe & Dunlevy LLC

(57) ABSTRACT

A semiconductor product includes a layer of semiconductor die package molding material embedding a semiconductor die having a front surface and an array of electrically-conductive bodies such as spheres or balls around the semiconductor die. The electrically-conductive bodies have front end portions around the front surface of the semiconductor die and back end portions protruding from the layer of semiconductor die package molding material. Electrically-conductive formations are provided between the front surface of the semiconductor die and front end portions of the electrically-conductive bodies left uncovered by the package molding material. Light-permeable sealing material can be provided at electrically-conductive formations to facilitate inspecting the electrically-conductive formations via visual inspection through the light-permeable sealing material.

14 Claims, 9 Drawing Sheets

(51) Int. Cl.
*H01L 23/00* (2006.01)
*H01L 23/31* (2006.01)
*H01L 25/065* (2023.01)

(52) U.S. Cl.
CPC .......... *H01L 23/3185* (2013.01); *H01L 24/11* (2013.01); *H01L 24/13* (2013.01); *H01L 24/20* (2013.01); *H01L 25/0652* (2013.01)

(58) Field of Classification Search
CPC . H01L 2224/77155; H01L 2224/82102; H01L 24/18; H01L 24/23; H01L 24/71; H01L 24/73; H01L 24/80; H01L 24/81; H01L 24/82; H01L 24/91; H01L 24/92; H01L 24/94; H01L 2224/18; H01L 2224/19; H01L 2224/23–24101; H01L 2224/24151–24153; H01L 2224/244; H01L 2224/245; H01L 2224/25–251; H01L 2224/254; H01L 2224/91; H01L 2224/92; H01L 2224/9212–92125; H01L 2224/92142–92143; H01L 21/76885; H01L 23/481; H01L 23/482; H01L 23/485; H01L 23/4855; H01L 23/488; H01L 21/683–6836; H05K 3/10; H05K 3/12; H05K 3/1241; H05K 3/125; H05K 3/22–249

See application file for complete search history.

(56) References Cited

U.S. PATENT DOCUMENTS

| | | | |
|---|---|---|---|
| 2010/0314780 A1* | 12/2010 | Camacho | H01L 24/19 257/E23.116 |
| 2012/0104590 A1* | 5/2012 | Do | H01L 24/19 438/109 |
| 2012/0211892 A1 | 8/2012 | Kim et al. | |
| 2013/0341789 A1* | 12/2013 | Camacho | H01L 23/49811 257/737 |
| 2018/0108638 A1 | 4/2018 | Lin et al. | |

* cited by examiner

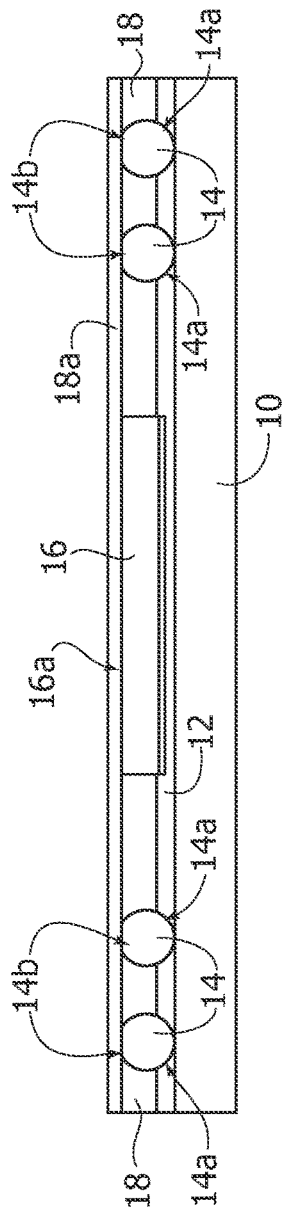
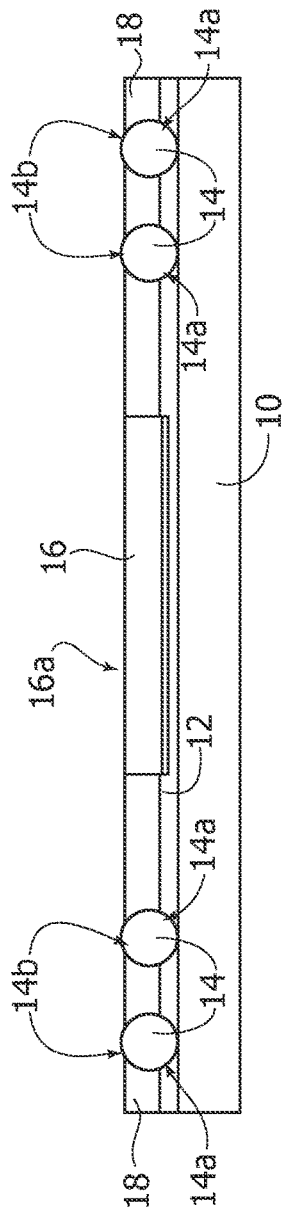

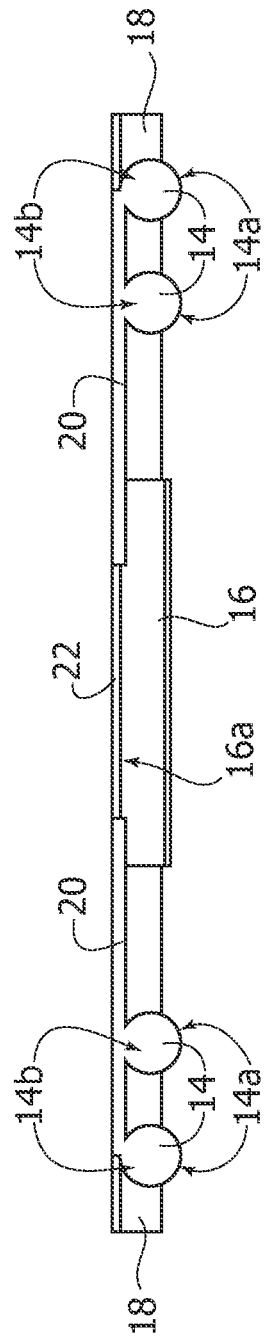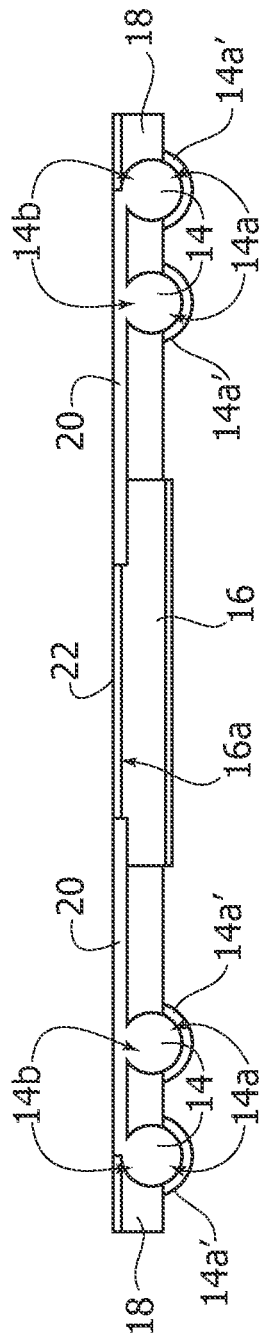

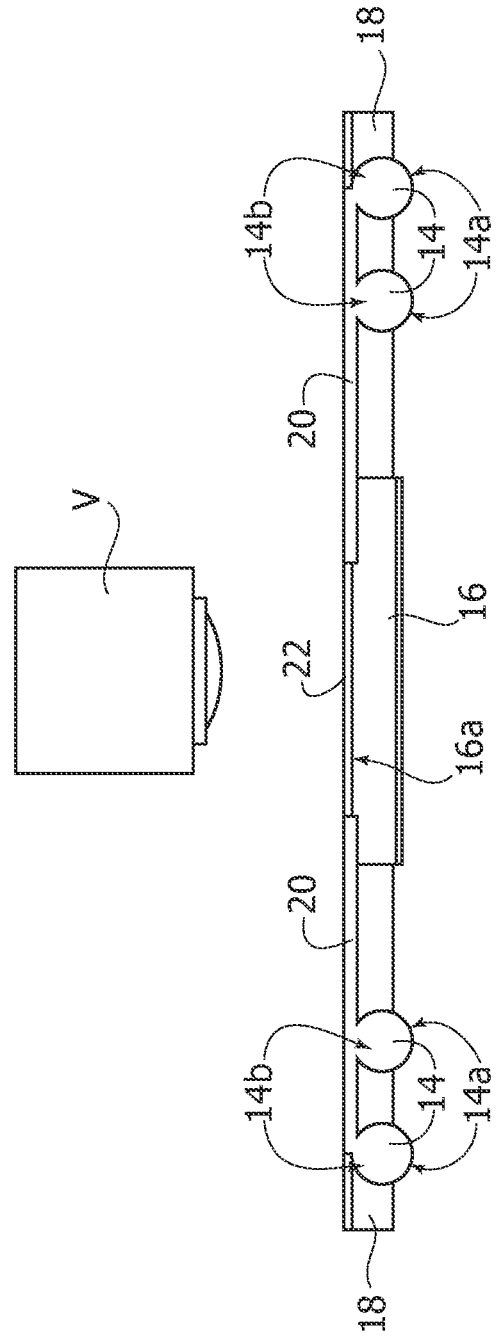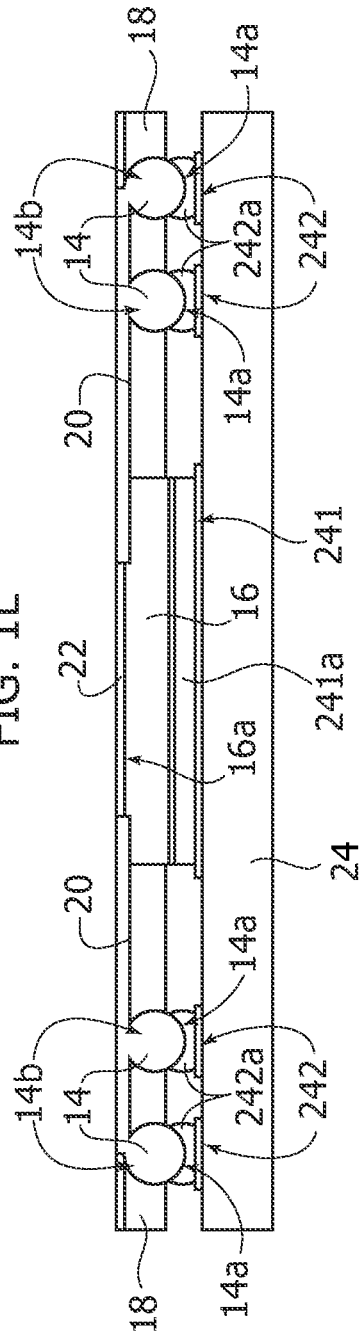

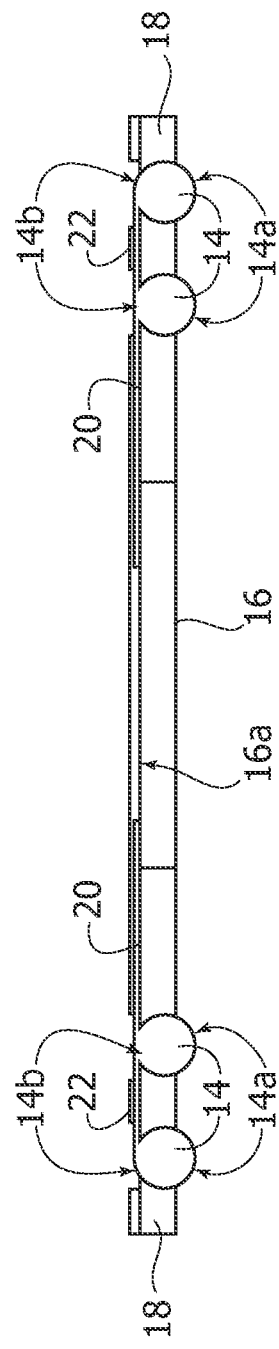
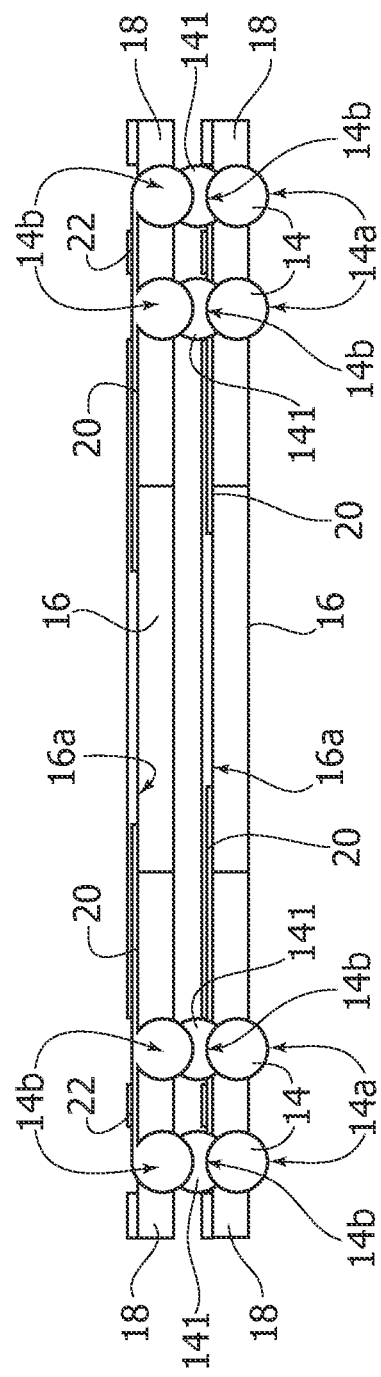
FIG. 4A
FIG. 4B

METHOD OF MANUFACTURING SEMICONDUCTOR PRODUCTS, SEMICONDUCTOR PRODUCT, DEVICE AND TESTING METHOD

PRIORITY CLAIM

This application claims the priority benefit of Italian Application for Patent No. 102020000001729, filed on Jan. 29, 2020, the content of which is hereby incorporated by reference in its entirety to the maximum extent allowable by law.

TECHNICAL FIELD

The description relates to semiconductor products.

One or more embodiments may be applied, for instance, to semiconductor products with plastic packaging.

BACKGROUND

Reducing packaging thickness and stresses transmitted to solder joints and, possibly, facilitating visual inspection of multi-row packaging may be points of interest for various types of semiconductor products such as integrated circuits (ICs), for instance.

Low thickness is a feature pursued in so-called ultra-thin ball-grid-array (BGA) arrangements with coreless substrate.

A drawback of such arrangements may lie in that coreless substrates may be more expensive than standard substrates and, in any case, more expensive than solutions relying on internal processes such as full molded packaging, for instance.

An approach to reduce stresses transmitted to solder joints may involve increasing module stand-off, that is the distance between a semiconductor die or chip as used in a product as considered herein and an associated support element.

In arrangements relying on BGA technology, increasing stand-off may lead to an undesirable reduction of the pitch between adjacent balls.

In arrangements relying on QFN (Quad Flat No-lead) technology, increasing stand-off may result in reduced contact grip.

There is a need in the art to overcome the drawbacks of conventional solutions as discussed in the foregoing.

SUMMARY

One or more embodiments may relate to a method.

One or more embodiments may relate to a corresponding semiconductor product.

One or more embodiments may relate to a corresponding semiconductor device of a stacked type.

One or more embodiments may relate to a test method for semiconductor devices.

One or more embodiments may propose a new packaging flow providing an ultra-thin, flexible package of the coreless and leadframe-less type.

In one or more embodiments, a semiconductor die or chip may be assembled along with electrically-conductive bodies (such as spheres or small cylinders comprising metal such as copper, for example) on an adhesive layer such as an adhesive tape or a so-called B-stage adhesive layer applied with a screen printing process, for instance.

A molding step such as a film-assisted molding may follow.

In one or more embodiments, die pads can be connected to metal contact bodies such as—for instance—spheres (balls), cylinders or prisms (parallelepipeds) by forming conductive tracks over the molding (by jet-printing followed by copper electroplating, for instance).

In one or more embodiments, a final insulating level may seal the die-active area and the conductive tracks (as provided by jet printing, screen printing or molding, for instance).

In one or more embodiments, a transparent sealing material can be used which facilitates making the (inner row) solder joints visible from the device top which may facilitate (automatic) visual inspection of solder joints.

One or more embodiments can be applied also to wafers with standard thicknesses (375 or 280 micron, for instance).

In one or more embodiments, stresses can be lowered as result of increased packaging flexibility facilitated by dedicated shape matching of the wire loops.

BRIEF DESCRIPTION OF THE DRAWINGS

One or more embodiments will now be described, by way of example only, with reference to the annexed figures, wherein:

FIGS. 1A to 1L are exemplary of possible steps or acts in embodiments,

FIGS. 4A and 4B are exemplary of a possibility of extending embodiments to a multi-level (stacked) arrangement.

It will be appreciated that, for the sake of simplicity and clarity of explanation, the various figures may not be drawn to a same scale.

DETAILED DESCRIPTION

In the following description, various specific details are given to provide a thorough understanding of various exemplary embodiments of the present specification. The embodiments may be practiced without one or several specific details, or with other methods, components, materials, etc. In other instances, well-known structures, materials, or operations are not shown or described in detail in order to avoid obscuring various aspects of the embodiments. Reference throughout this specification to "one embodiment" or "an embodiment" means that a particular feature, structure, or characteristic described in connection with the embodiment is included in at least one embodiment. Thus, the possible appearances of the phrases "in one embodiment" or "in an embodiment" in various places throughout this specification are not necessarily all referring to the same embodiment. Furthermore, particular features, structures, or characteristics may be combined in any suitable manner in one or more embodiments.

The headings/symbols provided herein are for convenience only, and therefore do not interpret the extent of protection or scope of the embodiments.

Figure 1A:
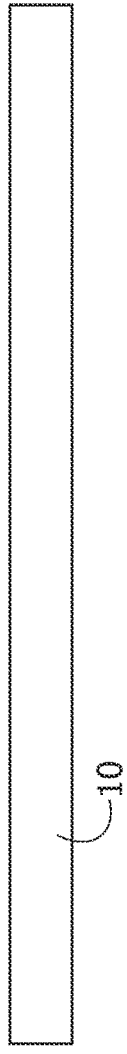
Figure 1B:
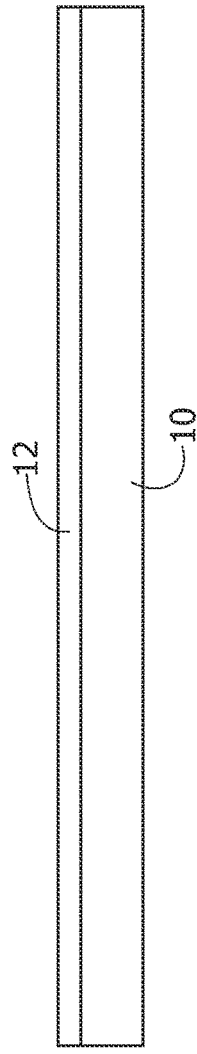

FIG. 1A is exemplary of the provision of a substrate such as an aluminum plate 10 onto which an adhesive layer 12 is provided as exemplified in FIG. 1B.

In one or more embodiments, the adhesive layer 12 may comprise a bi-adhesive tape applied (laminated) onto the substrate 10.

In one or more embodiments, such a tape for the layer 12 may have a thickness of about 0.04-0.05 mm, for instance, and may include a backing such as a polyimide film backing (25 micron, for instance) onto which adhesive silicone (12.5 micron, for instance) is provided on both surfaces to provide a desired bi-adhesive behavior.

As discussed, other types of adhesive layers such as a so-called B-stage adhesive layer applied with a screen printing process, for instance, can be used in embodiments.

Figure 1C:
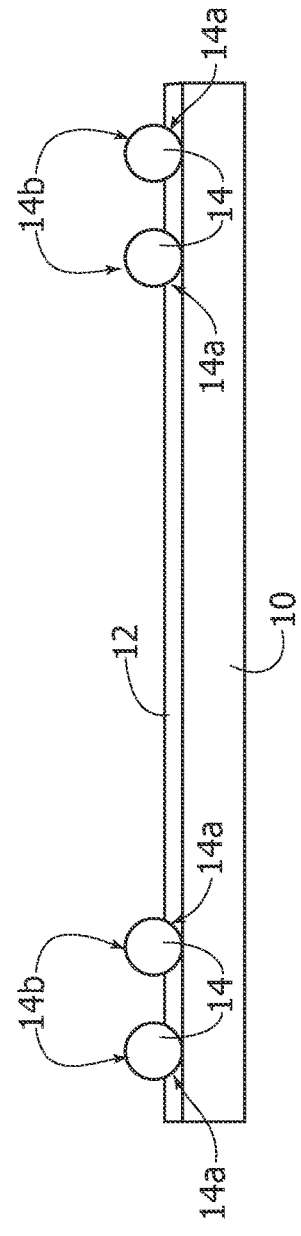

FIG. 1C is exemplary of the placement of an array of electrically-conductive bodies 14 (such as spheres or "balls") intended to provide an array of electrical contacts as discussed in the following.

Throughout this description, the designations "sphere" and "ball" will be used interchangeably, essentially as synonyms according to the current terminology in the art (ball-grid-array or BGA, for instance). It will be otherwise understood that, as used herein, the term "sphere" refers to a spherical shape which can be achieved only approximately in current manufacturing processes.

In one or more embodiments, the metal bodies 14 can comprise copper spheres.

In one or more embodiments, the spheres 14 can be solder-plated spheres.

For instance, spheres as exemplified herein are currently available with Nippon Micrometal Corporation, a company of the Nippon Steel Group. Such spheres or balls may include a spherical core having a diameter of 100-150 micron with a 25 micron lead-free plating (Sn, Sn—Ag, Sn—Cu, SnAgCu alloys, for instance) formed thereon, this resulting in ball diameter of 150-200 micron.

While FIGS. 1A to 1L, 2, 3 and 4A, 4B exemplify electrically-conductive bodies 14 in the form of spheres or "balls", one or more embodiments are not restricted to the use of such spherical bodies. For instance, FIGS. 5 to 8 exemplify the possible use of electrically-conductive bodies 14 in the form of (small) cylinders. Such bodies (contacts) can be obtained, for instance, by cutting (via laser cutting, for instance, copper wire (0.3 mm diameter, for instance).

Also, copper wire having a cross-section other than a round cross-section (a polygonal cross-section such as an approximately rectangular or square cross-section, for instance) can be used as the starting material for the bodies 14 thus resulting in bodies 14 having a shape different from a cylindrical shape, such as a prism (e.g. parallelepiped) shape, for instance.

These bodies 14 can be provided (in manner known to those of skill in the art) with surface plating such as tin plating, for instance.

In one or more embodiments, conductive bodies such as spheres 14 may be placed onto the substrate 10 (a conventional pick-and-place automated tool may be used for that purpose) so that the spheres 14 are partly embedded in the bi-adhesive tape 12 with the possibility, for their bottom or "back" ends 14a, that is, the bottom "polar" regions of the spheres 14 (the same also applying to the bottom or proximal ends of the bodies 14 of FIGS. 5 to 8, likewise labeled 14a) in the vicinity or in contact with the substrate 10 acting as a support element 10.

One or more embodiments may take advantage of a placement force selected, as a function of parameters such the shape and the size of the bodies 14 (sphere diameter, for instance) and/or thickness and stiffness of the adhesive layer 12 in such a way to result in the bodies 14 being in contact at their back ends 14a with the surface of the substrate 10. This facilitates achieving a co-planarity specification of 50 microns.

Figure 1D:
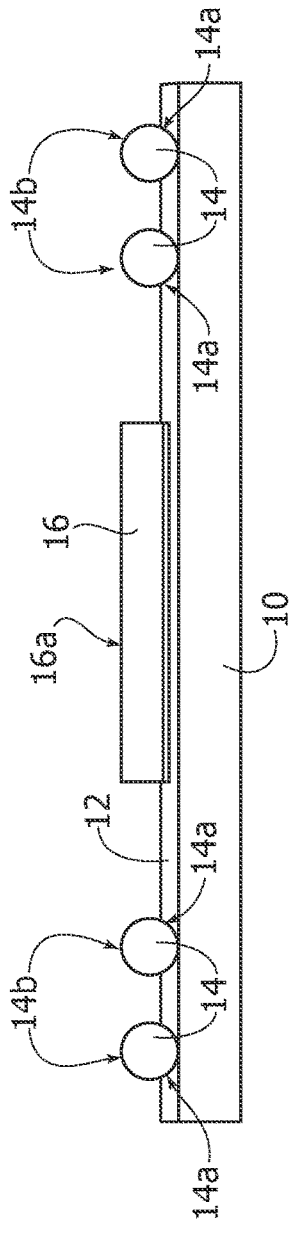

FIG. 1D is exemplary of a semiconductor chip or die 16 having a front or top surface 16a arranged (attached) onto the substrate 10 (that is, onto the adhesive layer 12) in an area generally surrounded by the array formed by the bodies 14.

Again, placement of the die 16 may occur via a conventional automated pick-and-place tool.

Also, a plurality of dice 16 can be arranged in an area generally surrounded by the array of spheres 14.

A single semiconductor die 16 will be referred to in the following for simplicity.

As noted—FIGS. 1A to 1L, 2, 3 and 4A, 4B refer by way of example to electrically-conductive bodies 14 in the form of spheres or "balls". It is otherwise understood that one or more embodiments are not restricted to the use of such bodies of spherical shape. Illustrative embodiments using bodies 14 with a shape different from a spherical shape are discussed, for instance, in FIGS. 5 to 8 and the related description.

FIGS. 1E and 1F are exemplary of molding material of a conventional type 18 (an epoxy molding material for instance) applied onto the substrate 10 having the bodies (balls, for instance) 14 and the die 16 attached thereon via the adhesive layer 12. In one or more embodiments as illustrated herein, the molding material 18 is applied (in a manner known to those of skill in the art) in such a way that the top (front) surface of the die 10 is left exposed, uncovered by the molding material 18, the same also applying to the top or front end portions 14b of the bodies 14 (that is the top "polar" portions of the spheres 14 or the flat-top distal ends of the bodies 14 of FIGS. 5 to 8 all labeled 14b) opposed the substrate 10.

FIGS. 1E and 1F are illustrative of molding material 18 applied via a film-assisted molding process (of a conventional type) with the mold film being indicated at 18a in FIG. 1E.

In one or more embodiments as exemplified herein (where the adhesive layer 12 includes silicone-based adhesive tape), no adhesion can be expected to occur of the silicone glue (that is the tape 12) and the molding material such as an epoxy molding material 18 once cured.

Consequently, while the adhesive layer 12 as exemplified herein is applied on the whole surface of the substrate 10, the adhesive action thereof takes place primarily in connection with the bodies (spheres) 14 and the die 16.

Figure 3:
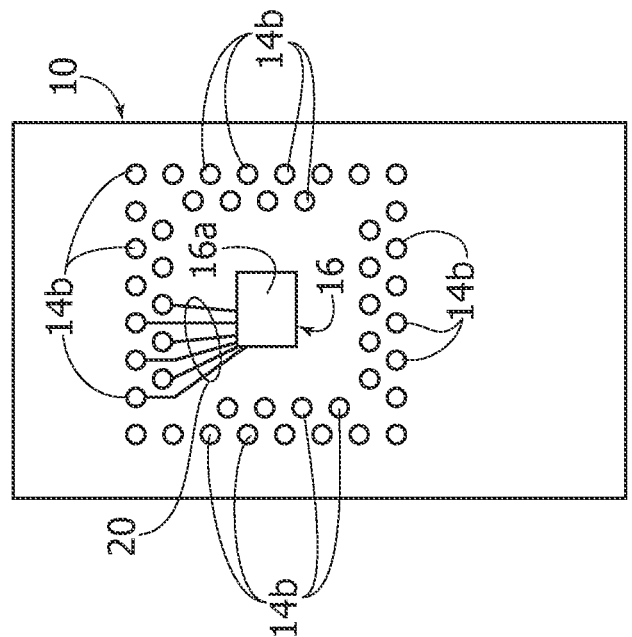
FIGS. 2 and 3 are schematic plan views illustrative of the results of certain steps in embodiments.
Figure 2:
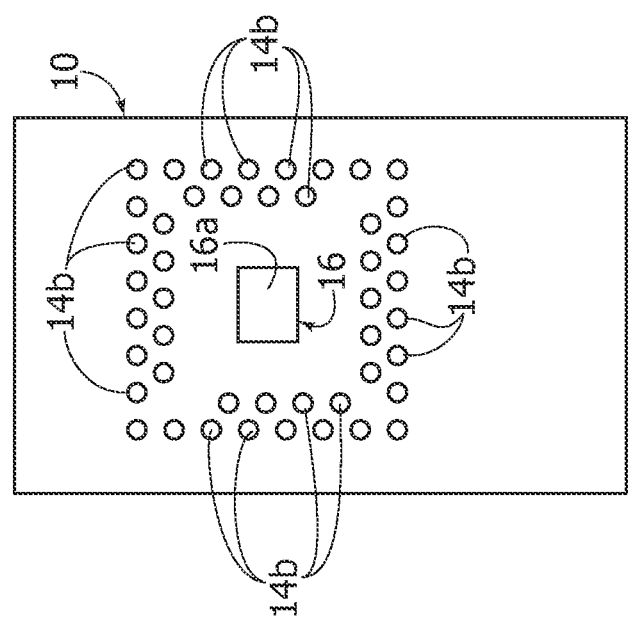

FIGS. 2 and 3 are exemplary plan views (from top) of the possible appearance of the assembly of elements as exemplified in FIG. 1F.

Figure 1H:
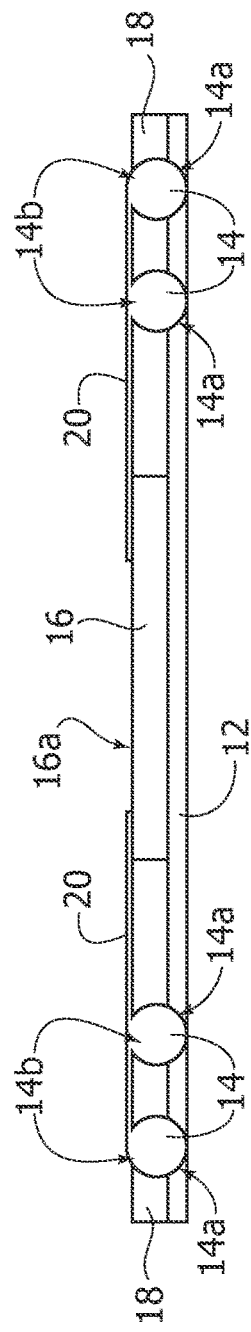
Figure 1H:
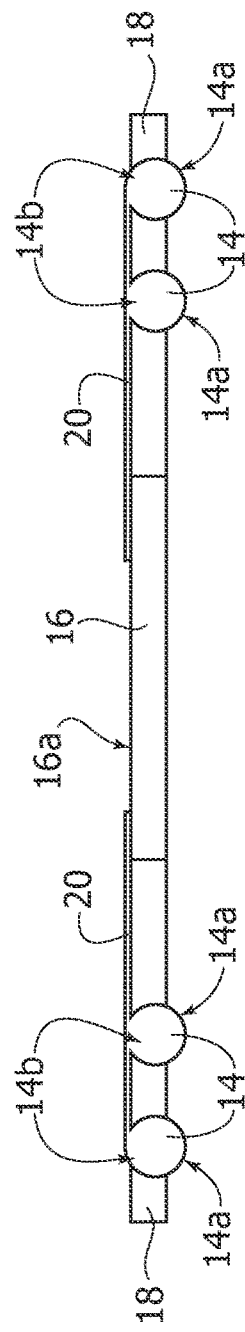
Figure 1H:
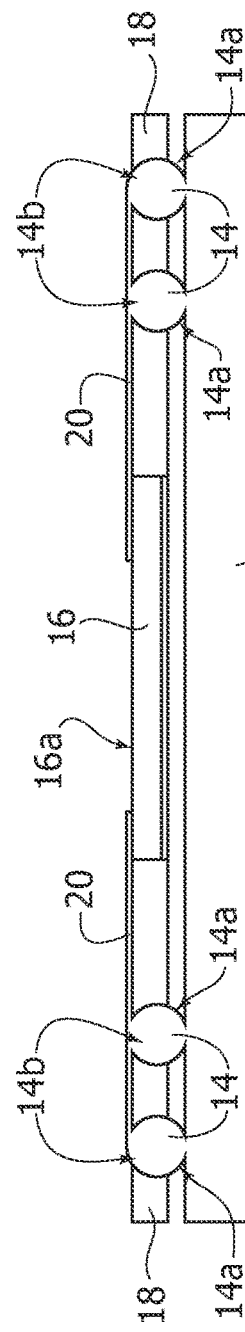
Figure 1H:
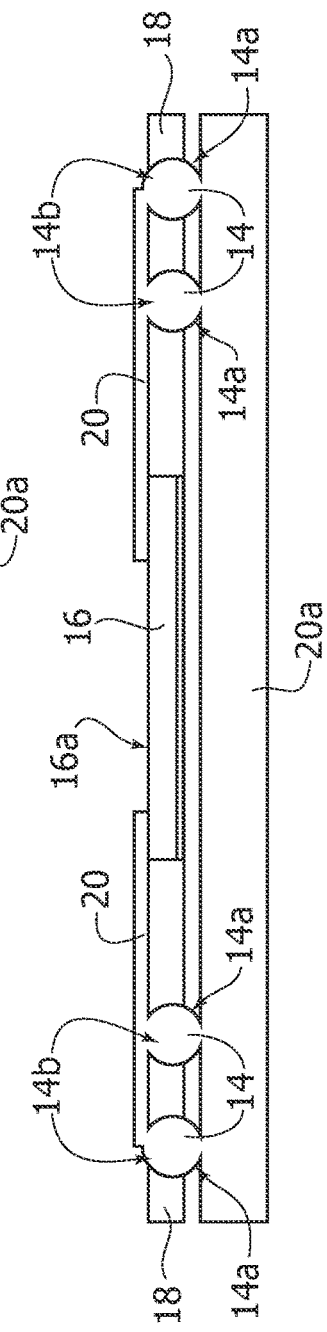

FIGS. 1G and 1H(a)-1H(d) are exemplary of the provision of electrically-conductive formations (tracks or lines) 20 coupling (at their front regions or ends 14b) selected ones of the bodies (spheres or balls, for instance) 14 with corresponding die pads provided at the top (front) surface 16a of the die 16. Such die pads, conventionally included in a die such as 16, are not visible in the figures due to scale factors.

The tracks or lines 20 can be provided according to a desired configuration as a function of the characteristics and the intended use of the die 16 (and the semiconductor product as a whole) based on routing criteria that are known to those of skill in the art.

As exemplified herein, providing the electric-conductive formations 20 may involve first dispensing an ink (a copper-based ink, for instance) which may occur via a jet printer providing a thickness of the formations of 10-15 micron.

As exemplified herein, printing of such an electrically-conductive ink may be followed by electrochemical growth of copper tracks (in the so-called z-axis direction) to provide electrically-conductive formations 20 having a larger cross-sectional area and thus improved conductivity.

In one of more embodiments, such processing may involve:

- removing the substrate 10—as illustrated in FIG. 1H(a),
- removing the adhesive layer 12—as illustrated in FIG. 1H(b),
- shorting via an electrically-conductive (copper, for instance) plate 20a the back end portions 14a of the bodies (spheres) 14, that is those ends formerly facing the substrate 10—as illustrated in FIG. 1H(c), and
- increasing the thickness (that is the cross-sectional area) of the electrically-conductive formations 20 via a copper plating, for instance—as exemplified in FIG. 1H(d).

Those of skill in the art will appreciate that the sequence of FIG. 1H(a)-1H(d) is merely for the sake of simplicity and clarity of description. Certain operations or acts as exemplified herein may in fact be performed concurrently with one another and/or in a different order from the sequence of FIG. 1H(a)-1H(d).

FIG. 1I is exemplary of the provision (via jet-printing, for instance) of a dielectric cover (sealing) layer 22, extending over the electrically-conductive formations 20 and the top (front) surface 16a of the die 16 with the dielectric layer 22 possibly having a (slightly) greater thickness at the top surface 16a the die 16.

Printing of the dielectric layer 22 may be possibly followed by processing including, for instance, UV cure and/or thermal curing processes.

FIG. 1J is exemplary of the possible provision of plating 14a' such as Tin or AuPd plating over the back end surfaces 14a of the balls 14 protruding at the (lower or back) surface of the molding 18.

A step as exemplified in FIG. 1J may be avoided in those cases where the balls 14 are already pre-plated (this is the case of the Nippon Micrometal spheres 14 discussed above, which are already provided with a 25 micron lead-free-plating).

FIG. 1K is exemplary of the possibility of providing as the sealing material (that is the dielectric layer 22 and/or the molding material 18) a light-permeable material such as transparent dielectric material or molding material.

This may facilitate visual inspection (for instance via automated visual inspection apparatus V, of known type per se) so that the solder joint may be visually inspected through the transparent sealing material.

It will be appreciated that such a measure, that is providing such a sealing mass of light-permeable sealing material at least at the electrically-conductive formations 20 and inspecting the electrically-conductive formations (the solder joints thereof, for instance) via visual inspection through the light-permeable sealing material, is not limited to semiconductor products as exemplified herein but can be applied, in general, to testing other types of semiconductor products comprising a sealing mass having embedded therein at least one semiconductor die having a front surface and electrically-conductive formations at the front surface of the semiconductor die. Products such as (multi-row) QFN products using a leadframe may be exemplary of such other types of semiconductor products.

FIG. 1L is exemplary of the possibility of mounting an assembly as exemplified in FIG. 1K onto a base layer 24 possibly including electrically-conductive layers/formations (that is pads or lands, for instance) at the die 16 (see, for instance, a die pad as exemplified at 241) and at the bodies (spheres) 14: see, for instance, the lands 242. Such mounting may involve using conventional solder material as exemplified at 241a and 242a.

FIG. 4A is exemplary of the possibility of performing a step as exemplified in FIG. 1I (that is applying the dielectric layer 22, via jet printing, for instance) by refraining from dispensing such dielectric material (at a portion or the totality) of the bodies 14.

In one or more embodiments, two (or more) assemblies as exemplified in FIG. 4A can thus be stacked (at SMT level, for instance) by taking advantage of the bodies 14 being arranged (at least partly) at homologous locations in the assemblies which are stacked. Coupling of bodies such as spheres 14 in the assemblies which are stacked may occur via electrically-conductive material (solder material, for instance) material at mutually facing ends 14a, 14b as exemplified at 141 in FIG. 4B.

The assembly at the top (upper) position in the stack may be possibly further protected by dielectric material 22 applied (also) at the spheres 14.

Stacks as exemplified in FIG. 4B (including two or more elements in the stack) may be mounted on a substrate 24 as exemplified in FIG. 4L. Similarly, a stacked arrangement as exemplified in FIG. 4B lends itself to the possible use of transparent sealing material as discussed previously.

FIGS. 5 to 8 are exemplary of the possibility, for one or more embodiments, of using electrically-conductive bodies 14 different from spheres or balls as discussed so far in connection with FIGS. 1A to 1L, 2, 3 and 4A, 4B.

As already discussed, one or more embodiments may adopt electrically-conductive bodies 14 in the form of (small) cylinders or prism-shaped (e.g. parallelepiped) bodies which can be obtained, for instance, by cutting (via laser cutting, for instance) a wire having a round cross-section or a wire having a polygonal cross-section such as approximately rectangular or square cross-section, for instance.

For brevity, the whole sequence of FIGS. 1A to 1L, 2, 3 and 4A, 4B and the related description will not be repeated here in connection with electrically-conductive formations 14 in the form of (small) cylinders or prism-shaped bodies. It will be otherwise understood that, with the exception of the different shape of the bodies 14, the disclosure of illustrative embodiments as provided in connection with those figures applies also to embodiments where the bodies 14 have a shape different from a spherical shape.

Figure 5:
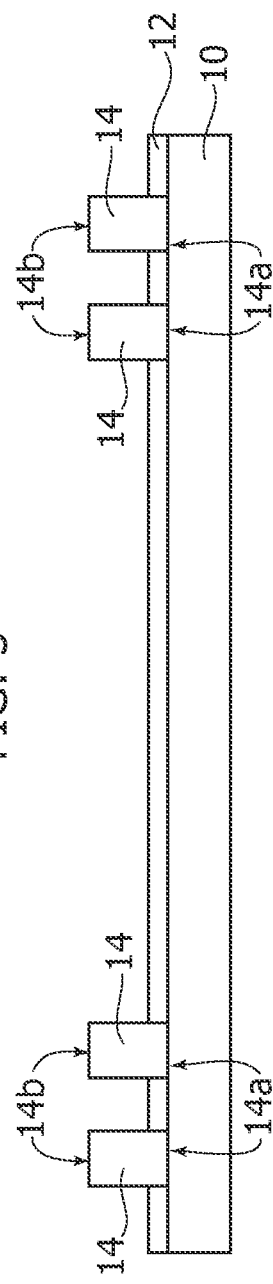
FIGS. 5 to 8 are illustrative of possible variants of embodiments.
Figure 6:
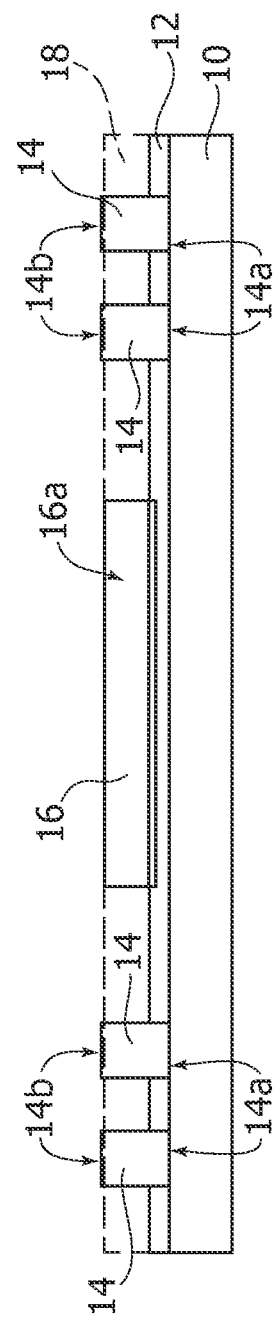
Figure 7:
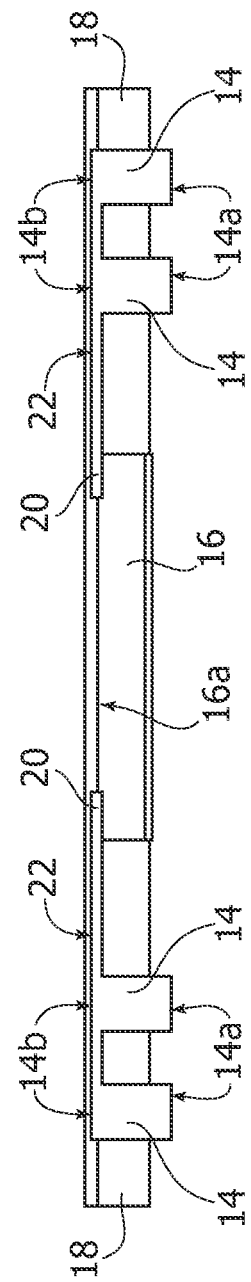
Figure 8:
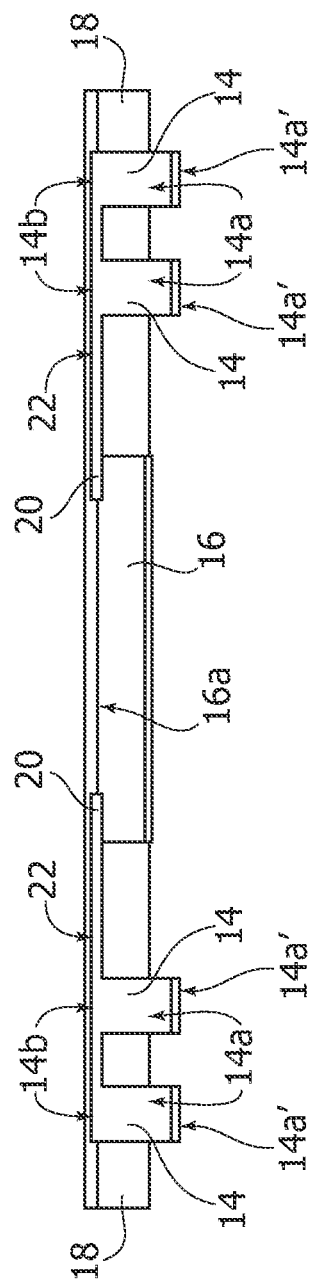

By way of synthesis:

FIG. 5 essentially corresponds to FIGS. 1C and 1s exemplary of the placement onto the adhesive layer 12 of an array of electrically-conductive bodies 14 intended to provide an array of electrical contacts as discussed in the following;

FIG. 6 essentially corresponds to FIGS. 1D-1F and is exemplary of a semiconductor chip or die 16 having a front or top surface 16a arranged (attached) onto the substrate 10 (that is, onto the adhesive layer 12) so that the die 16 is arranged in an area generally surrounded by the array of formation 14; the outline of a molding material 18 subsequently molded thereon by leaving the front or top surface 16a of the die 16 and the front or top ends 14b of the bodies 14 exposed (uncovered by the molding material 18) is indicated in dashed lines;

FIG. 7 essentially corresponds to FIG. 1I and is exemplary of the provision (via jet-printing, for instance) of a dielectric cover (sealing) layer 22, extending over the electrically-conductive formations 20 and the top (front) surface 16a of the die 16 with the dielectric layer 22 possibly having a (slightly) greater thickness at the top surface 16a the die 16. Also in this case, printing of the dielectric layer 22 may be possibly followed by processing including, for instance, UV cure and/or thermal curing processes;

FIG. 8 essentially corresponds to FIGS. 1J and 1s exemplary of the possible provision of plating 14a' such as Tin or AuPd plating over the back end surfaces 14a of the bodies 14 protruding at the (lower or back) surface of the molding 18.

In this latter respect it will be appreciated that, in the case of cylindrical/prism (e.g. parallelepiped) bodies obtained by cutting a wire, such a plating—as (possibly) already present on the other surface of the wire—will not extend to surfaces such as 14a resulting from cutting (severing) the wire. Such a surface may thus benefit from plating as exemplified at 14a' in FIG. 8.

One or more embodiments as exemplified herein may be used to advantage in connection with dice 16 having thicknesses as low as 0.2 mm or below.

For instance, embodiments using spheres or balls as the bodies 14 may be applied to very thin dice (thickness less than 150 micron).

A high degree of accuracy in placement of the formations 14 is facilitated by the formations for each module being held by a single holder.

This may facilitate achieving a separation (pitch) between adjacent formations as low as 0.5 mm with a total thickness of an arrangement as exemplified in FIG. 1K or 4A as low as 0.36 mm.

It is observed that thicker dice may lead to using spheres or balls with a larger diameter, which may in turn leas to pitch issues.

Replacing spheres or balls with formations 14 of different shape (cylindrical, for instance) may facilitate rendering the Z dimension (die thickness) a parameter less related to spacing (Z2/Z3 dimensions).

As illustrated herein, a method of manufacturing semiconductor products which products comprise a semiconductor die (for instance, 16) having a front surface (for instance, 16a) with electrically-conductive formations (for instance, 20) at said front surface, may comprise: providing a substrate (for instance, 10) having an adhesive layer (for instance, 12) thereon; placing onto the adhesive layer on the substrate at least one semiconductor die having a front surface facing away from the substrate as well as an array of electrically-conductive bodies (for instance, 14) around the at least one semiconductor die, the electrically-conductive bodies having back end portions (for instance, 14a) protruding into the adhesive layer; molding package molding material (for instance, 18) onto the at least one semiconductor die and the electrically-conductive bodies placed onto the adhesive layer on the substrate, wherein the at least one semiconductor die and the electrically-conductive bodies in the array are embedded in the package molding material with the front surface of the at least one semiconductor die and front end portions of the electrically-conductive bodies left uncovered by the package molding material; and forming (a network of) electrically-conductive formations (for instance, 20) between the front surface of the at least one semiconductor die and front end portions of electrically-conductive bodies left uncovered by the package molding material.

A method as illustrated herein may comprise separating from the adhesive layer and said substrate said at least one semiconductor die and said electrically-conductive bodies embedded in said package molding material, wherein said electrically-conductive bodies protrude from said package molding material at said back end portions.

In a method as illustrated herein, said package molding material may comprise curable molding material which, once cured, is free from adhesion to said adhesive layer.

In a method as illustrated herein, forming said electrically-conductive formations may comprise: printing electrically-conductive material (ink, for instance) to provide electrically-conductive printed formations; and plating electrically-conductive material onto said electrically-conductive printed formations.

A method as illustrated herein may comprise electrically shorting (for instance, 20a) said electrically-conductive bodies at said back end portions protruding from said package molding material at said back end portions prior to plating electrically-conductive material onto said electrically-conductive printed formations.

In a method as illustrated herein, said electrically-conductive bodies may comprise electrically-conductive bodies selected out of balls, cylinders and prisms (e.g. parallelepipeds).

A method as illustrated herein may comprise providing said electrically-conductive bodies by cutting, optionally laser cutting, a wire-like member.

A method as illustrated herein may comprise providing a dielectric (sealing) layer (for instance, 22) over the front surface of the at least one semiconductor die and said electrically-conductive bodies.

A semiconductor product as illustrated herein may comprise: a layer of semiconductor die package molding material having embedded therein at least one semiconductor die having a front surface and an array of electrically-conductive bodies around the at least one semiconductor die, the electrically-conductive bodies having opposed front and back end portions, the front end portions of the electrically-conductive bodies arranged around said front surface of the at least one semiconductor die and said back end portions protruding from the layer of semiconductor die package molding material away from said front surface of the at least one semiconductor die; and (a network of) electrically-conductive formations between the front surface of the at least one semiconductor die and front end portions of electrically-conductive bodies left uncovered by the package molding material.

In a semiconductor product as illustrated herein, said electrically-conductive formations may comprise electrically-conductive (ink) printed formations having electrically-conductive material plated thereon.

In a semiconductor product as illustrated herein, said electrically-conductive bodies may comprise electrically-conductive bodies selected out of balls, cylinders and prisms (e.g. parallelepipeds).

A stacked semiconductor device as illustrated herein may comprise at least one first and at least one second semiconductor product, the first and second semiconductor products being as illustrated herein, wherein electrically-conductive bodies in the first semiconductor product have their front end portions electrically coupled (for instance, at 141) to back end portions of electrically-conductive bodies in the second semiconductor product.

As illustrated herein, a method of testing semiconductor products comprising a sealing mass (for instance, 18, 22) having embedded therein at least one semiconductor die having a front surface and electrically-conductive formations at the front surface of the at least one semiconductor die may comprise: providing in said sealing mass light-permeable sealing material (at least) at said electrically-conductive formations; and inspecting (for instance, V) said electrically-conductive formations via visual inspection through said light-permeable sealing material.

The details and embodiments may vary with respect to what has been disclosed herein and merely by way of example without departing from the extent of protection. The extent of protection is determined by the annexed claims.

The claims are an integral part of the technical disclosure of embodiments as provided herein.

The invention claimed is:

1. A method of manufacturing semiconductor products, comprising:
    providing an adhesive layer on a surface of a substrate;
    placing a semiconductor die onto the adhesive layer wherein a front surface of said semiconductor die faces away from the substrate;
    placing an array of electrically-conductive bodies onto the adhesive layer at positions around the semiconductor die, the electrically-conductive bodies having back end portions protruding into the adhesive layer;
    molding a package material onto the semiconductor die and the array of electrically-conductive bodies such that the semiconductor die and the electrically-conductive bodies are embedded in a package with the front surface of the semiconductor die and front end portions of the electrically-conductive bodies being uncovered at a front surface of said package; and
    forming electrically-conductive formations extending on said front surface of the package between the front surface of the semiconductor die and the front end portions of the electrically-conductive bodies left uncovered at the front surface of the package.

2. The method of claim 1, comprising separating said package including said semiconductor die and said electrically-conductive bodies from the adhesive layer and said substrate, wherein said back end portions of the electrically-conductive bodies protrude from a rear surface of said package.

3. The method of claim 1, wherein said package material comprises a curable molding material that, once cured, is free from adhesion to said adhesive layer.

4. The method of claim 1, wherein forming the electrically-conductive formations comprises:
    printing an electrically-conductive material on the front surface of the package to provide electrically-conductive printed formations; and
    plating another electrically-conductive material onto said electrically-conductive printed formations.

5. The method of claim 4, further comprising:
    separating said package including said semiconductor die and said electrically-conductive bodies from the adhesive layer and said substrate, wherein said back end portions of the electrically-conductive bodies protrude from a rear surface of said package; and
    electrically shorting the back end portions of said electrically-conductive bodies prior to plating the other electrically-conductive material.

6. The method of claim 1, wherein said electrically-conductive bodies have a shape selected from a group consisting of: balls, cylinders and prisms.

7. The method of claim 1, comprising providing said electrically-conductive bodies by cutting a wire-like member.

8. The method of claim 1, comprising providing a sealing layer over the front surface of the package including over the front surface of the semiconductor die, the front end portions of the electrically-conductive bodies and the electrically-conductive formations.

9. The method of claim 8, wherein the sealing layer is made of a light-permeable sealing material.

10. The method of claim 9, further comprising visually inspecting the electrically-conductive formations through the light-permeable sealing material of said sealing layer.

11. A method of manufacturing semiconductor products, comprising:
    providing an adhesive layer on a surface of a substrate;
    placing a semiconductor die onto the adhesive layer;
    placing an array of electrically-conductive structures onto the adhesive layer, the electrically-conductive structures having back end portions protruding into the adhesive layer;
    providing a first transparent material around the semiconductor die and the array of electrically-conductive structures such that the semiconductor die and the electrically-conductive structures are embedded in a package with front end portions of the electrically-conductive structures being uncovered at a front surface of said package;
    forming electrical connection tracks extending on said front surface of the package in contact with the front end portions of the electrically-conductive structures and electrically coupled to die pads of the semiconductor die;
    removing the package from the substrate and adhesive layer;
    mounting said package to a base layer by soldering the back end portions of the electrically-conductive structures to conductive lands of the base layer; and
    visually inspecting, through the first transparent material, solder joints formed between the electrically-conductive structures and the conductive lands.

12. The method of claim 11, further comprising covering the electrical connection tracks and the front surface of the package with a second transparent layer, and wherein visually inspecting comprises visually inspecting, through the first and second transparent layers, solder joints formed between the electrically-conductive structures and the conductive lands.

13. The method of claim 11, wherein forming the electrical connection tracks comprises:
    printing an electrically-conductive material on the front surface of the package to provide electrically-conductive printed formations; and
    plating another electrically-conductive material onto said electrically-conductive printed formations.

14. The method of claim 12, wherein said electrically-conductive structures have a shape selected from a group consisting of: balls, cylinders and prisms.

* * * * *

UNITED STATES PATENT AND TRADEMARK OFFICE
CERTIFICATE OF CORRECTION

| | | |
|---|---|---|
| PATENT NO. | : 12,021,052 B2 | Page 1 of 1 |
| APPLICATION NO. | : 17/158781 | |
| DATED | : June 25, 2024 | |
| INVENTOR(S) | : Fulvio Vittorio Fontana | |

It is certified that error appears in the above-identified patent and that said Letters Patent is hereby corrected as shown below:

In the Specification

At Column 6, Line 47, [[ FIGS. 1C and 1s ]] should be corrected to read -- FIG. 1C and is --

At Column 7, Line 3, [[ FIGS. 1J and 1s ]] should be corrected to read -- FIG. 1J and is --

Signed and Sealed this
Eleventh Day of November, 2025

John A. Squires
*Director of the United States Patent and Trademark Office*